(12) United States Patent
Khoueir et al.

(10) Patent No.: US 10,095,568 B2
(45) Date of Patent: Oct. 9, 2018

(54) BACKGROUND READS TO CONDITION PROGRAMMED SEMICONDUCTOR MEMORY CELLS

(71) Applicant: Seagate Technology, LLC, Cupertino, CA (US)

(72) Inventors: Antoine Khoueir, Apple Valley, MN (US); Stacey Secatch, Longmont, CO (US); Kevin Gomez, Eden Prairie, MN (US); Ryan Goss, Prior Lake, MN (US)

(73) Assignee: Seagate Technology LLC, Cupertino, CA (US)

(*) Notice: Subject to any disclaimer, the term of this patent is extended or adjusted under 35 U.S.C. 154(b) by 0 days.

(21) Appl. No.: 15/498,595

(22) Filed: Apr. 27, 2017

(65) Prior Publication Data

US 2018/0225164 A1    Aug. 9, 2018

Related U.S. Application Data

(63) Continuation-in-part of application No. 15/427,825, filed on Feb. 8, 2017.

(51) Int. Cl.

| | |
|---|---|
| *G11C 16/04* | (2006.01) |
| *G06F 11/07* | (2006.01) |
| *G11C 16/16* | (2006.01) |
| *G11C 16/34* | (2006.01) |
| *G11C 16/26* | (2006.01) |

(52) U.S. Cl.
CPC .......... *G06F 11/076* (2013.01); *G06F 11/073* (2013.01); *G11C 16/16* (2013.01); *G11C 16/26* (2013.01); *G11C 16/3459* (2013.01)

(58) Field of Classification Search
CPC ..... G11C 16/10; G11C 16/28; G11C 16/3459; G11C 16/14; G06F 12/0246
USPC ...................................................... 365/185.24
See application file for complete search history.

(56) References Cited

U.S. PATENT DOCUMENTS

| | | | |
|---|---|---|---|
| 5,511,022 A | 4/1996 | Yim et al. | |
| 6,646,922 B2* | 11/2003 | Kato ..................... | B82Y 10/00 365/185.03 |
| 7,177,191 B2 | 2/2007 | Fasoli et al. | |
| 7,817,469 B2 | 10/2010 | Avraham et al. | |
| 7,818,525 B1 | 10/2010 | Frost et al. | |
| 7,876,620 B2 | 1/2011 | Mokhlesi et al. | |
| 8,107,296 B2 | 1/2012 | Sarin et al. | |

(Continued)

*Primary Examiner* — Richard Elms
*Assistant Examiner* — Xiaochun L Chen
(74) *Attorney, Agent, or Firm* — Hall Estill Attorneys at Law

(57) ABSTRACT

Method and apparatus for managing data in a semiconductor memory, such as but not limited to a three dimensional (3D) NAND flash memory array. In some embodiments, the memory has non-volatile memory cells arranged into addressable blocks. Each memory cell is configured to store multiple bits. A program/read control circuit programs data sets to and reads data sets from the memory cells in the addressable blocks to service a sequence of host access commands. The circuit concurrently performs background reads in conjunction with the servicing of the host access commands. The background reads result in the reading of a different data set from each of the addressable blocks over each of a succession of time intervals of selected duration. The background reads condition the memory cells prior to a first read operation associated with the host access commands.

20 Claims, 11 Drawing Sheets

(56) References Cited

U.S. PATENT DOCUMENTS

| | | |
|---|---|---|
| 9,019,775 B2 | 4/2015 | Costa et al. |
| 9,111,800 B2 | 8/2015 | Scheuerlein |
| 9,142,302 B2 | 9/2015 | Dong et al. |
| 9,230,665 B2 | 1/2016 | Hosono |
| 9,236,393 B1 | 1/2016 | Cernea |
| 9,318,209 B1 | 4/2016 | Huynh et al. |
| 9,412,471 B2 | 8/2016 | Kim et al. |
| 9,952,944 B1 * | 4/2018 | Alrod .................. G06F 11/1068 |
| 2004/0170079 A1 * | 9/2004 | Leung ................... G11C 11/406 |
| | | 365/222 |
| 2005/0013164 A1 * | 1/2005 | Kato ....................... B82Y 10/00 |
| | | 365/185.2 |
| 2005/0281112 A1 * | 12/2005 | Ito ......................... G11C 11/406 |
| | | 365/222 |
| 2009/0116270 A1 | 5/2009 | Scheuerlein |
| 2013/0070530 A1 * | 3/2013 | Chen ....................... G11C 5/063 |
| | | 365/185.11 |
| 2013/0141971 A1 | 6/2013 | Hosono |
| 2013/0258770 A1 * | 10/2013 | Goss ....................... G11C 16/26 |
| | | 365/185.02 |
| 2014/0063972 A1 | 3/2014 | Maeda |
| 2016/0056050 A1 | 2/2016 | Kong et al. |
| 2016/0056168 A1 | 2/2016 | Lue |
| 2016/0180946 A1 * | 6/2016 | Hong ...................... G11C 16/26 |
| | | 365/185.11 |
| 2017/0236595 A1 * | 8/2017 | Maejima ............ G11C 16/0483 |
| | | 365/185.12 |
| 2018/0113759 A1 * | 4/2018 | Alrod ................ G06F 11/1068 |
| 2018/0114580 A1 * | 4/2018 | Alrod ................ G11C 16/3418 |

\* cited by examiner

READ/PROGRAM VERIFY (PV) CIRCUIT

PROGRAMMING CIRCUIT

US 10,095,568 B2

BACKGROUND READS TO CONDITION PROGRAMMED SEMICONDUCTOR MEMORY CELLS

RELATED APPLICATION

The present application is a continuation-in-part of co-pending U.S. patent application Ser. No. 15/427,825 filed Feb. 8, 2017, the contents of which are hereby incorporated by reference.

SUMMARY

Various embodiments disclosed herein are generally directed to the management of data in a semiconductor memory, such as but not limited to a three dimensional (3D) NAND flash memory array.

In accordance with some embodiments, the memory has non-volatile memory cells arranged into addressable blocks. Each memory cell is configured to store multiple bits. A program/read control circuit programs data sets to and reads data sets from the memory cells in the addressable blocks to service a sequence of host access commands. The circuit concurrently performs background reads in conjunction with the servicing of the host access commands. The background reads result in the reading of a different data set from each of the addressable blocks over each of a succession of time intervals of selected duration. The background reads condition the memory cells prior to a first read operation associated with the host access commands.

In further embodiments, a method includes servicing a plurality of host access commands to transfer data between a host device and a semiconductor memory. The semiconductor memory has memory cells arranged into addressable blocks, with each of the memory cells characterized as a non-volatile memory cell and configured to store multiple bits. The method further includes performing a plurality of background reads during the servicing step upon the addressable blocks. The background reads serve to read a different data set from each of the addressable blocks over each of a succession of time intervals of selected duration to condition the memory cells prior to a first read operation associated with the host access commands.

These and other features and advantages which may characterize various embodiments can be understood in view of the following detailed discussion and the accompanying drawings.

DETAILED DESCRIPTION

Figure 1:
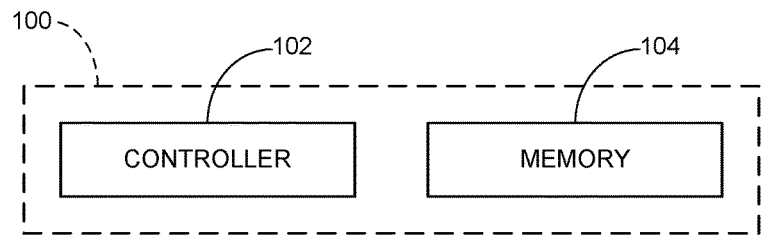
FIG. 1 provides a functional block representation of an exemplary data storage device in accordance with some embodiments.

The present disclosure generally relates to the management of data in a stacked semiconductor memory, such as but not limited to a three dimensional (3D) NAND flash memory array.

Data storage devices are provided with one or more memory devices to store and/or retrieve computerized data. Some solid-state semiconductor based memory devices, such as flash memory, utilize the transfer of charge to establish programming states in individual memory cells.

Flash memory stores data in the form of accumulated charge on floating gates of flash memory cells. The memory cells may be characterized as nMOSFETs (n-channel metal oxide semiconductor field effect transistors) with a floating gate structure that is electrically isolated from a main control gate of each transistor. The memory cells store substantially no accumulated charge on the floating gates in an erased state, and store increased amounts of accumulated charge when programmed. Programming operations cause migration of charge from the main channel to the floating gates, and erasure operations migrate charge from the floating gates to reset the cells to a base (erased) state. One or more bits may be stored in each programmed cell.

Some NAND flash devices arrange the flash memory cells in a stacked, or three dimensional (3D) array configuration. Each stack of flash memory cells may include any number of flash cells with the various gate structures accessed by control lines (e.g., bit lines, source lines, word lines, selection lines, etc.) that extend through the array. A number of different 3D NAND configurations are known in the art, including a gate stack type NAND flash memory where channel current flows vertically and gates are horizontally shared, and a channel stack type NAND flash memory where channel current flows horizontally and the gates are vertically shared.

The use of 3D NAND flash and other forms of stacked semiconductor memory configurations can provide a number of advantages, including increased data storage capacity for a given semiconductor footprint. Semiconductor lithography techniques are often limited to a minimum feature (F) size, usually on the order of a few tens of nanometers (e.g, 19 nm, 25 nm, 45 nm, etc.). The memory cell dimensions in the horizontal direction are largely constrained by the minimum feature size of the associated semiconductor fabrication process. By growing the stack vertically, however, many "horizontal layers" of memory cells can be incorporated into the same device, significantly increasing the overall total number of memory cells in the array.

While operable, some forms of 3D NAND flash memory arrays may experience a higher than normal number of bit errors during the first data read operation upon a given set of data after the data have been programmed to the array. This condition is referred to herein as a "first read effect" or "floating body effect" where a step-function improvement in error rate is observed between the first read operation on the data and subsequent read operations on the data.

As a result of an investigation into this phenomenon, it has been determined that residual charge may tend to accumulate within the channel body at least at certain locations within the array during the program operation. This accumulated charge does not affect the amounts of charge that have been stored to the floating gate structures. However, the presence of this additional charge interferes with the initial sensing of the floating gate states, causing misreads in the programmed bit values in the memory cells.

In theory, it is believed that this effect should not be observed since most programming operations include a follow up read verify (RV) operation, also referred to as a program verify (PV) operation, to verify that the final desired programming states have been achieved. The application of the PV operation should be sufficient to drain any residual charge from the channel.

Various embodiments of the present disclosure are accordingly directed to an apparatus and method for managing data in a stacked semiconductor memory array, such as but not limited to a 3D NAND flash memory array. As explained below, some embodiments include the use of a non-volatile memory comprising stacked memory cells arranged into addressable blocks, with each of the memory cells configured to store multiple bits. A program/read control circuit is configured to program data sets to and read data sets from the memory cells in the addressable blocks to service a sequence of host access commands.

During a background refresh mode, the program/read control circuit performs background reads on various locations in the memory in an effort to stabilize the stacked memory cells. A timer circuit may be initialized so that the background read operation is repeated over each of a succession of time intervals of selected duration.

The background reads are scheduled to be performed on a recurring basis. The duration of the interval can be adaptively adjusted over time, such as to match workload requirements, reduce overall RBER (observed raw bit error rate) performance, etc.

The background reads are applied so that each erasure block in the memory receives at least one read operation during each interval. The amount of data that is read from each block may be a page of data or some other relatively small amount of data, such as the smallest amount of data that may be retrieved using a read operation. In some cases, a different page of data is read from each block during each interval. The selected pages may be incremented, randomly selected, etc.

The background read operation may be a continuous feature that is always on when the drive is in an active state, or the operation may be selectively engaged once a selected level of host I/O activity is detected. The operation may further be a user selectable option. When activated, the background read operations occur in conjunction with the servicing of normal access commands (e.g., read and write commands) that are used to transfer data between the memory array and a host device, as well as internal transfers to move data sets from one location to another (e.g., garbage collection, etc.).

It is contemplated that the background reads will operate to refresh the various blocks at a sufficiently frequent rate such that, for each of at least a significant portion of the blocks in the memory, at least one of the background read operations will be performed prior to a first normal read operation upon that block since the most recent write operation that was carried out to that block. In this way, the first normal read operation (and all subsequent read operations) will exhibit a more stabilized RBER, and overall RBER performance of the device will be improved.

These and other features and aspects of various embodiments will be understood beginning with a review of FIG. 1 which generally illustrates an exemplary data storage device 100. The device 100 includes a controller 102 and a memory module 104. The controller 102 provides top level control for the device 100 and may be configured as a programmable processor with associated programming in local memory. Additionally or alternatively, the controller may take the form of a hardware based control circuit with logic gates or other elements to carry out the required controller functions.

The memory module 104 can be arranged as one or more non-volatile memory elements including rotatable recording discs and solid-state memory arrays. While a separate controller 102 is shown in FIG. 1, such is unnecessary as alternative embodiments may incorporate any requisite controller functions directly into the memory module. While not limiting, for purposes of the present discussion it will be contemplated that the data storage device 100 is a solid-state drive (SSD) that utilizes a three dimensional (3D) NAND flash memory array that makes up at least some of the memory capacity of the memory module to provide a main data store for a host device (not shown). Other forms of stacked semiconductor memory can be used.

Figure 2:
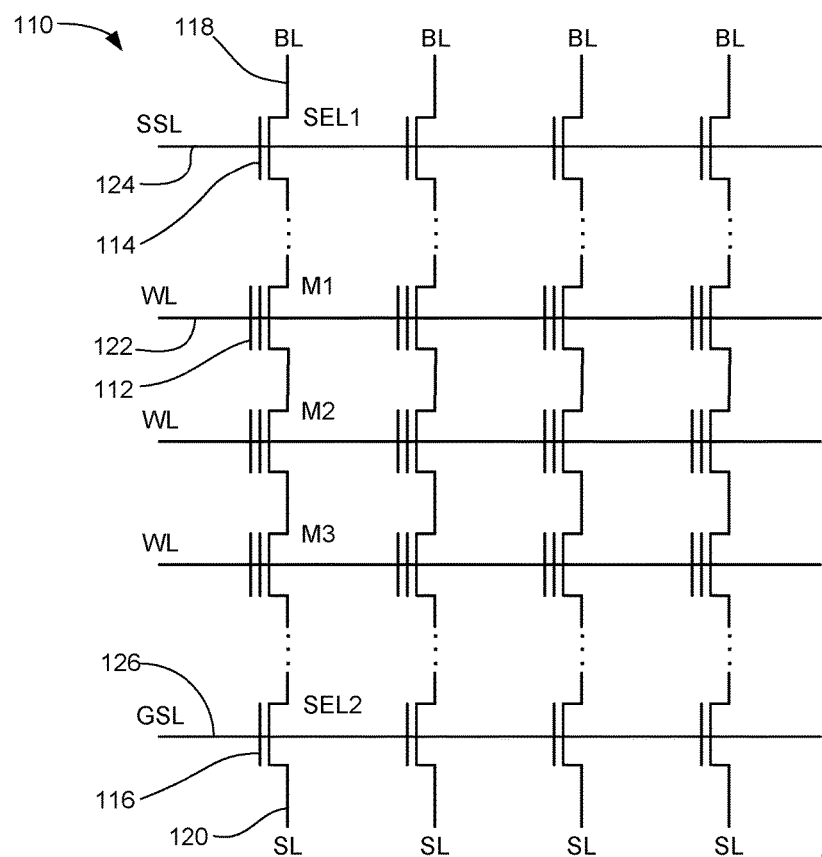
FIG. 2 is a schematic depiction of a portion of a stacked, or three dimensional (3D) NAND flash memory array of the device of FIG. 1 in some embodiments.

FIG. 2 provides a schematic depiction of a portion of a 3D NAND flash memory array 110 of the memory module 104 of FIG. 1 in accordance with some embodiments. Other configurations can be used so that FIG. 2 is merely exemplary and not limiting. The arrangement in FIG. 2 is a two dimensional (2D) layout similar to a conventional 2D NAND configuration. It is contemplated albeit not required that each column in FIG. 2 represents a vertical stack of elements within the 3D array.

A number of flash memory cells 112 are denoted as M1, M2 and M3. Any suitable number of the flash memory cells 112 can be provided in each stack. The memory cells 112 are bounded by a first selection device 114 (SEL1) and a second selection device 116 (SEL2). The selection devices may each take a MOSFET transistor configuration.

A bit line (BL) 118 (upper control line) connects to one end of each stack and a source line (SL) 120 (lower control line) connects to the opposing end. During normal program (write) and read operations, current is passed from the BL to the SL through each stack in turn. This may take place by connecting the BL to a suitable rail voltage, such as 3.3V, and connecting the SL to a suitable reference level, such as electrical ground. A series of word lines (WL) 122 are connected to control gate structures of the memory cells 112. Variable gate control voltages are supplied to the memory cells 112 via the WLs. Separate selection control lines 124 and 126 (SSL and GSL) are used to select the select devices 114, 116.

A page of data may be stored along the memory cells 112 attached to a common word line, so that a single bit of a given page is stored in each memory cell along a given row. Groups of the memory cells may be arranged into higher operable units, such as erasure blocks which constitute the smallest number of the memory cells that can be erased at a time. Garbage collection units (GCUs) may be formed from multiple erasure blocks. The GCUs may be allocated and garbage collected as a unit to recondition and reallocate after use.

Figure 3:
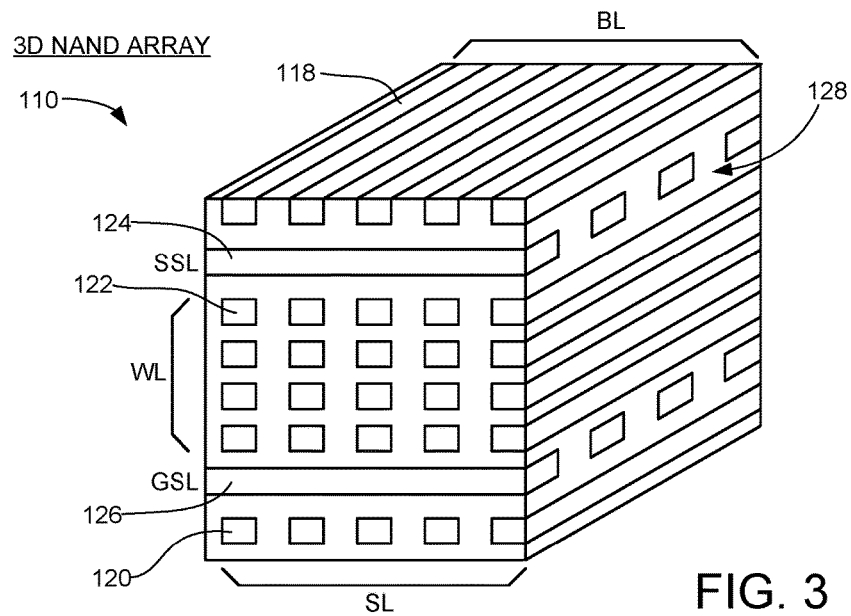
FIG. 3 is a simplified isometric representation of the stacked flash memory array in some embodiments.

FIG. 3 shows a portion of the 3D NAND flash memory array 110 from FIG. 2. The various control lines (e.g., BLs, SLs, WLs, SSLs, GSLs) are shown to extend through a main body portion 128 of the array 110 in respective parallel or orthogonal directions to make the requisite interconnections to access the various internally disposed memory cells 112. Any number of other arrangements can be used so that FIG. 3 is merely illustrative and is not limiting.

Figure 4:
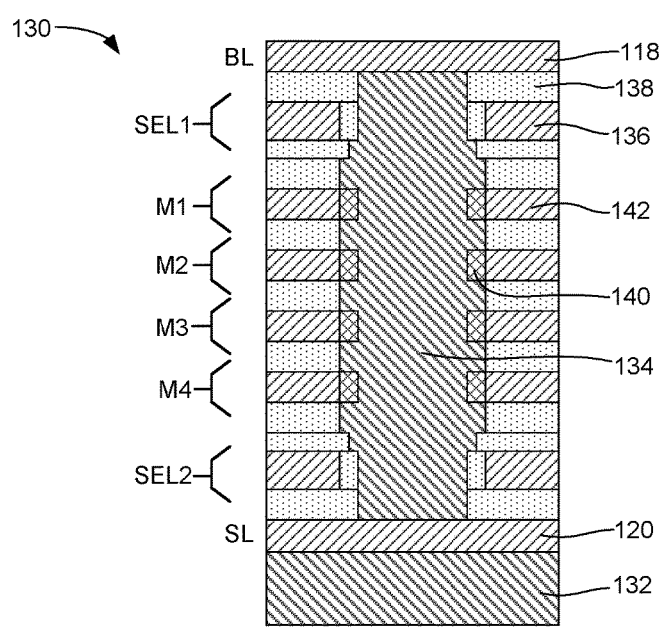
FIG. 4 is a cross-sectional representation of a stack of memory cells of the array of FIG. 3.

FIG. 4 shows a portion of the 3D NAND flash memory array 110 from FIG. 3 to illustrate aspects of a single stack 130 within the array 110. The diagram is somewhat simplified for clarity of illustration and, as before, other arrangements can be used as desired. The array 110 is built using known semiconductor fabrication techniques on an underlying substrate 132.

The various memory cells and selection devices from FIG. 2 (e.g., M1, SEL1, etc.) are generally indicated in FIG. 4, and are annular (circular) in nature so as to surround a central channel region 134. These elements are formed from different regions of conductive material such as regions 136 and insulative material such as regions 138. Other layers may be incorporated, such as insulative barrier layers between the BL, SL and the channel, but such are not shown for clarity. It will be noted that each of the memory cells M1-M4 share the common channel region 134.

Thin film floating gate structures are generally denoted at 140. The floating gates are electrically insulated from the central channel region 134 and control gate portions 142 of the memory cells 112. The program state of the various memory cells M1-M4 are established by accumulating charge on the respective floating gates 140. The floating body effect (first read effect) may arise as a result of trapped accumulated charge within the stack 130, such as within the central body channel 134 or other locations depending on the construction of the stack.

Figure 5:
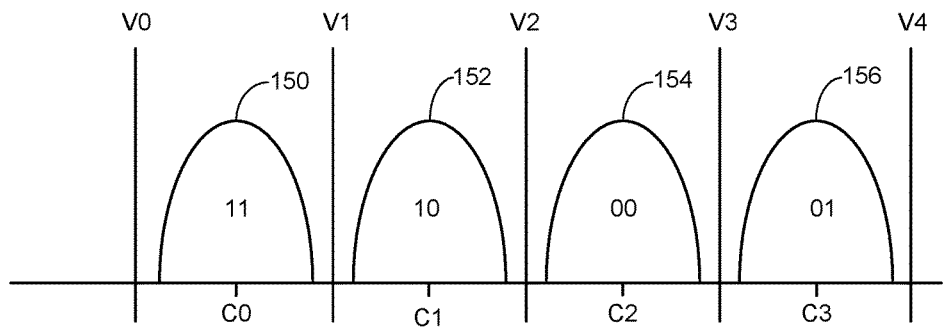
FIG. 5 shows multi-level cell (MLC) charge distributions indicative of different data storage states for the flash memory cells in the stacked flash memory array.

In order to set forth a detailed explanation of how various embodiments of the present disclosure mitigate the floating body effect, it will be helpful to first briefly discuss FIG. 5 which shows a sequence of charge distributions 150, 152, 154 and 156. These distributions represent different groupings of memory cells 112 from the array 110 that are programmed to different program states during normal programming operations.

While not limiting, it is contemplated that the various memory cells 112 are operated as multi-level cells (MLCs) so that each memory cell stores two (2) bits of user data. The two bits may correspond to two different pages of data written to the same set of MLCs. The available program states are shown as logical 11, 10, 00 and 01, respectively. Other conventions can be used. The most significant bit (MSB) may correspond to a first page of data, and the least significant bit (LSB) may correspond to a second page of data. Other arrangements can be used, including single level cells (SLCs) which store only a single bit per memory cell, three-level cells (TLCs) which store three bits per memory cell, etc.

Distribution 150 in FIG. 5 represents a first population of the memory cells 112 programmed to a first nominal charge level C0 (logical 11) state. Distribution 152 represents a second population of cells programmed to a second nominal charge level C1 (logical 10); distribution 154 represents a third population of cells programmed to a third nominal charge level C2 (logical 00); and distribution 156 represents a fourth population of cells programmed to a fourth nominal charge level C3 (logical 01).

The populations are shown to be substantially Gaussian about the nominal charge levels C0<C1<C2<C3. The variations in charge level arise as a result of a variety of operational factors. For example, during programming a charge pump may be used to transfer discrete quanta of charge to the cells, and this process may result in slightly different total amounts of accumulated charge on individual cells programmed to the same state. Other contributing factors can including aging, manufacturing variations, temperature, etc.

Figure 6:
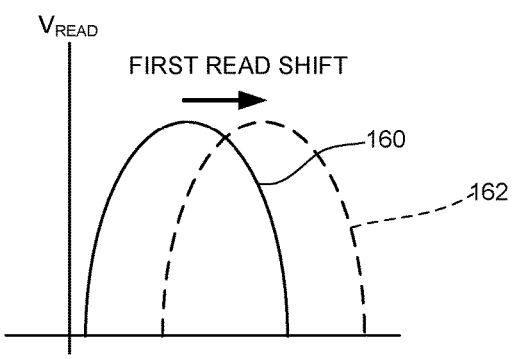
FIG. 6 illustrates an exemplary voltage shift that may arise during a first read operation after a programming operation for the memory cells of FIG. 5.

Normally, the distributions are sufficiently distinct such that intervening read sense voltages can be applied to differentiate between the respective distributions and identify the programmed state of a given cell. Four such read sense voltages are depicted in FIG. 6 as V1 through V4 with V1<V2<V3<V4. By way of illustration, the application of read sense voltage V3 to the control gates of the various flash cells in FIG. 2 (via word lines 122) would tend to be sufficient to place those cells in the distributions 150-154 into a conductive state (e.g., "turn on" the cells), whereas the cells in the remaining distribution 156 would remain in a non-conductive state. Voltage V0 would not turn on any of the memory cells, and voltage V4 would turn on all the cells.

The programmed state of any given cell can be sensed by the application of one or more of the sense voltages V1-V3 in a selected order. For example, a typical MLC read sequence might involve applying V2 to a given cell. If the cell turned on, V1 could then be applied to determine if the programmed state was 11 or 10. If the cell did not turn on, V3 could be applied to determine if the programmed state was 00 or 01.

FIG. 6 shows another charge distribution 160 to illustrate the observed shifting of charge observed as a result of the floating body effect. The distribution 160 corresponds to one of the distributions from FIG. 5 and represents the normal variation for a given state. Shifted distribution 162, shown in broken line fashion, shows a pronounced first read shift that is experienced the first time a set of the memory cells is read during a normal read operation after the memory cells were programmed. Other directions of shifting may occur, although in most cases it is contemplated that the accumulated charge will require higher control gate (WL) voltages to place the memory cells in a conductive state, thereby appearing to shift the distribution as shown. Subsequent reads will more accurately sense the population as corresponding to distribution 160.

Figure 7:
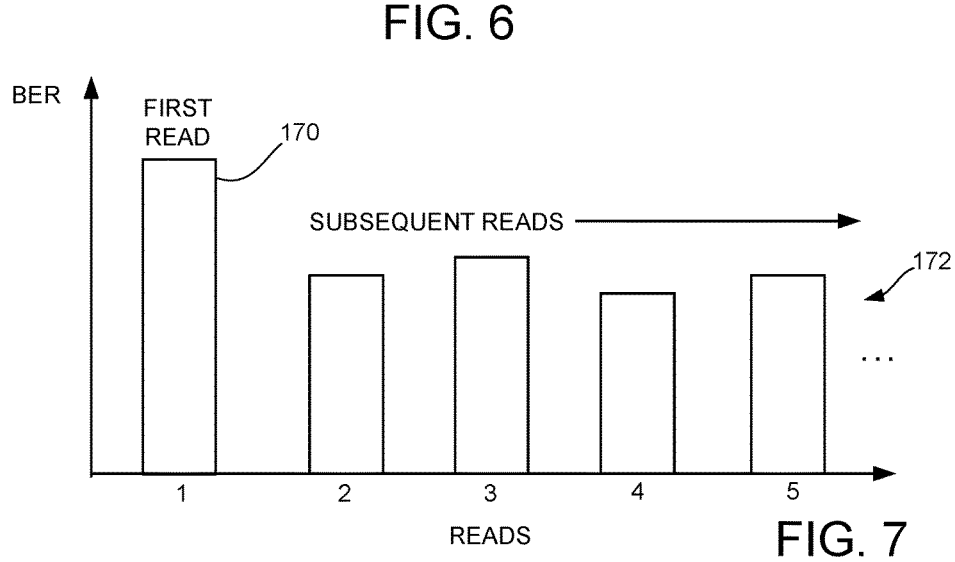
FIG. 7 shows a step-wise improvement in observed bit error rate (BER) after the first read after a programming operation.

FIG. 7 shows a graphical representation of a step-function bit error rate (BER) response for a given set of memory cells. The data shown in FIG. 7 is merely illustrative and not drawn to scale. Generally, the higher the BER along the y-axis, the higher the number of read errors experienced in the recovered data. Other conventions may be used.

As demonstrated by FIG. 7, a first read operation, indicated at bar 170, provides a statistically significant increase in the number of observed bit errors as compared to subsequent read operations, generally indicated at 172. The actual steady-state BER level will thereafter remain generally in this lower range after the step-function decrease from the first read. Eventually, longer term effects such as read disturb, temperature, adjacent reads/writes, etc. may ultimately increase the BER to the point where the data require rewriting to a new location. Nevertheless, the lower BER will continue to be experienced for some reasonable amount of time after the first read.

Figure 8:
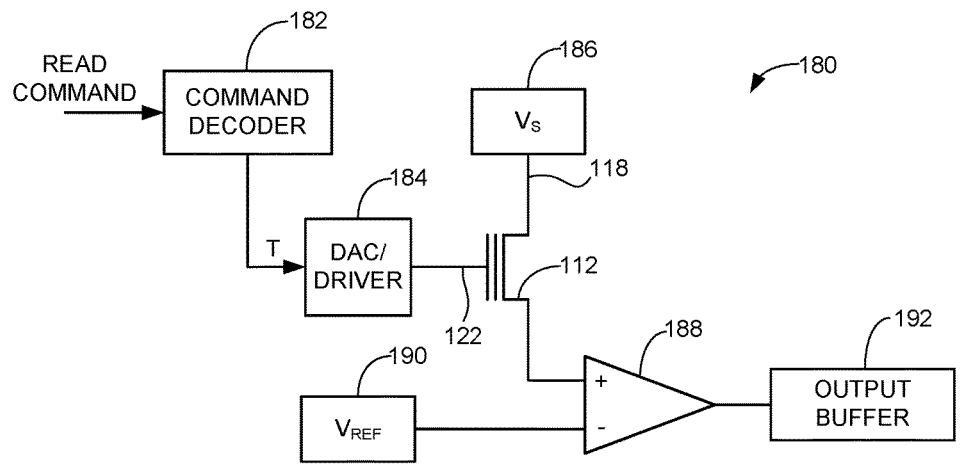
FIG. 8 depicts a read/program verify circuit adapted to read the storage states of the memory cells of FIG. 4 in accordance with some embodiments.

FIG. 8 is a functional block representation of a read/program verify (PV) circuit 180 of the storage device 100 in accordance with some embodiments. The circuit 180 is adapted to apply the read voltage thresholds of FIG. 5 during read operations as illustrated in FIG. 7 to detect the program states of the respective memory cells 112 in the array 110. Program verify operations during programming can also be carried out by the circuit, or a different dedicated circuit having a similar construction.

A command decoder 182 decodes an input read command and outputs an appropriate read threshold value T to a digital-to-analog (DAC) driver circuit 184. The threshold value T is a multi-bit digital representation of a selected analog voltage value such as from FIG. 5 (e.g., voltage V1, V2, V3 or V4), or some other programmable value. The DAC/driver 184 applies the corresponding analog voltage to the gate structure of the selected cell 112 via the associated word line 122 (see FIG. 2).

A voltage source 186 applies a suitable source voltage $V_S$ to the bit line 118 coupled to the memory cell 112 being read. A sense amplifier 188 determines whether the applied voltage is sufficient to place the cell 112 into a conductive state through a comparison with a reference voltage $V_{REF}$ from a reference voltage source 190. A resulting bit value is output to an output buffer 192 (e.g., a 0 or 1) responsive to the comparison. At this point it will be appreciated that program verify and read operations are carried out in a similar fashion. One difference is that a read operation for a memory cell storing more than a single bit may require multiple different voltage thresholds to discern the program state, whereas a program verify operation may involve the application of only a single voltage.

Figure 9:
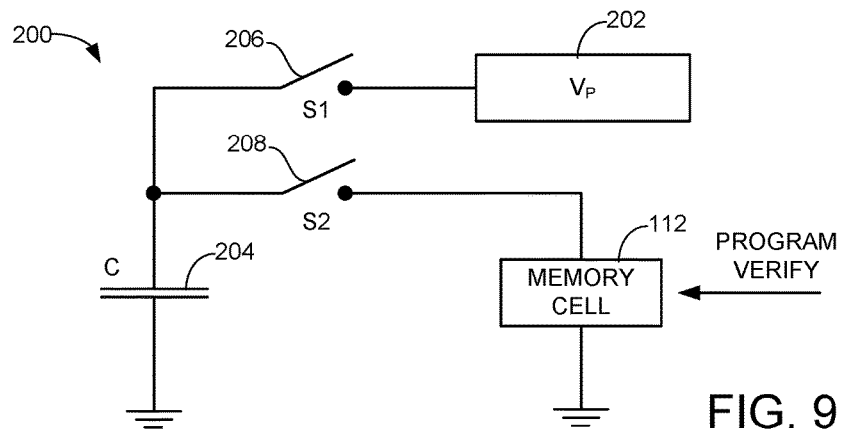
FIG. 9 illustrates a programming circuit adapted to write the storage states of FIG. 6 in accordance with some embodiments.

FIG. 9 is a functional block representation of a data programming circuit 200 of the data storage device 100. The circuit 200 is configured to transfer charge to the floating gates of the various memory cells 112 during programming operations.

The circuit 200 takes a general charge pump configuration with a programming voltage source 202 that supplies a suitable programming voltage $V_P$, a capacitor (C) 204 or other charge storage device, and a pair of switches 206, 208 denoted as switches S1 and S2. The switches can take any suitable form such as power MOSFETs.

The circuit operates to transfer discrete quanta of charge to the floating gate. To this end, one or more charge-transfer cycles are applied to the memory cell. During a charge cycle, switch S1 is closed, switch S2 is opened, and charge accumulates as the voltage $V_P$ is applied to the capacitor C. During a transfer cycle, switch S1 is opened and switch S2 is closed, enabling a transfer of the charge accumulated by the capacitor C to the memory cell 112.

The foregoing sequence is repeated as required until the total amount of accumulated charge on the floating gate of the memory cell 112 reaches a desired level indicative of the programming of the cell to the desired programmed state. A program verify operation is periodically carried out to assess the then-existing program state of the cell, using the read circuit 180 of FIG. 8. A suitable program verify threshold is used, which may be different from the various read thresholds depicted in FIGS. 5-6.

In some cases, a program verify operation is carried out after each charge transfer. In other cases, a selected number of charge transfers are applied before the program verify operations are applied.

Figure 10:
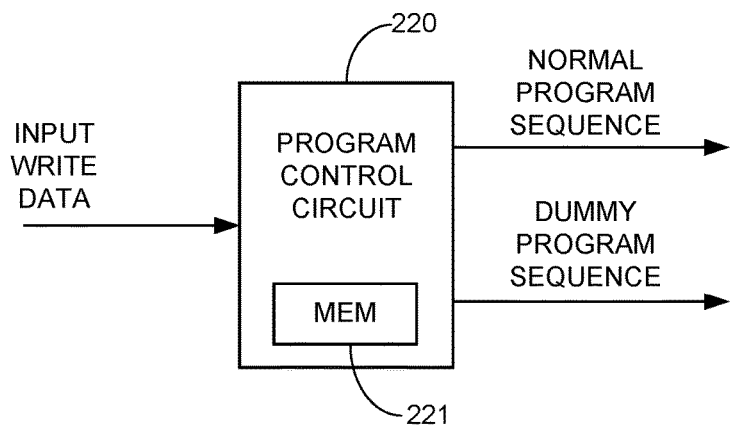
FIG. 10 is a functional block representation of a program control circuit in accordance with some embodiments.

FIG. 10 shows a program control circuit 220 used in accordance with various embodiments of the present disclosure. The program control circuit 220 can form a portion of the top level controller 102 (see FIG. 1), or can be a standalone circuit that operates in conjunction with the controller. The program control circuit 220 directs inputs to other aspects of the read/write circuitry of the device 100, such as the read/PV circuit 180 of FIG. 8 and the programming circuit 200 of FIG. 9. The program control circuit may store data and control values in a local memory (MEM) 221 during operation. The local memory 221 may also be used during other operations, such as to store previously stored data sets during a subsequent read operation.

The program control circuit 220 carries out two main programming sequences to program input data to the 3D NAND flash memory array 110. The first is a normal program sequence during which the respective circuits 180, 200 operate as discussed above to program input write data to a selected set of the memory cells 112. At the conclusion of the normal program sequence, the program control circuit 220 immediately follows up with the application of a dummy program sequence to the same set of memory cells.

The dummy program modifies the applied voltages to the memory cells to remove accumulated charge from the channel body. The bias condition can take a variety of forms depending on the construction of a given array. In some cases, the bias condition may include connecting both ends of the channel (e.g., the BL and SL) to electrical ground or other reference voltage level. The word lines (WL) may be floated or biased as required to slightly turn on each of the word lines. Other configurations may be used.

It will be noted at this point that the dummy program sequence does not alter the existing programmed states of the memory cells, but may be conditioned to operate as a follow up write (program) operation in which the system cycles through a second program effort. Special trim commands can be issued by the controller (see 102, FIG. 1) to perform the dummy program sequence. In this way, all of the pages in a given erasure block or GCU may be concurrently subjected to the process. This can be carried out efficiently by the NAND device internal logic responsive to the trim command.

Figure 11:
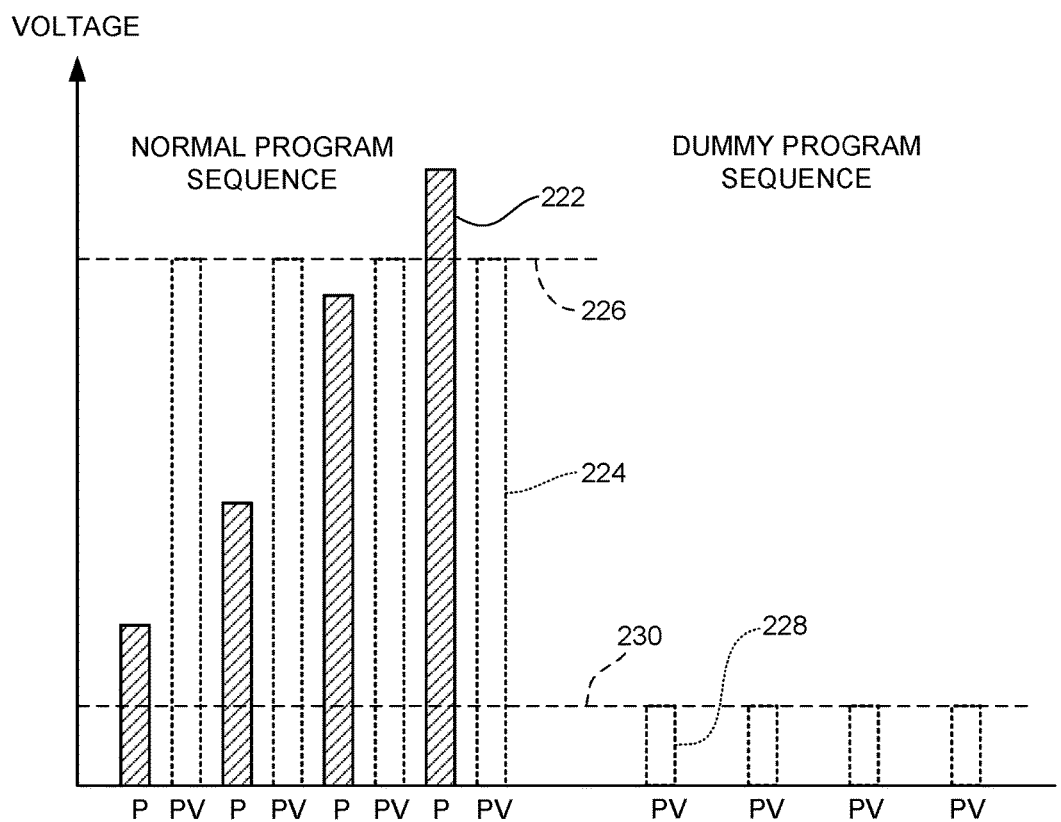
FIG. 11 illustrates respective program sequences carried out by the circuit of FIG. 10 in accordance with some embodiments.

FIG. 11 is a graphical representation of the respective normal and dummy program sequences. Bars 222 represent increases in program state of a given memory cell over successive programming (P) cycles, as discussed above in FIG. 9. The successively higher bars 222 indicate the continued accumulation of ever increasing amounts of charge on the associated floating gate.

Bars 224 represent program verify (PV) operations that are applied at the conclusion of each charge transfer cycle to determine if the desired program state has been reached, which is indicated by threshold 226. A larger number of charge transfers may be required to achieve a programmed state with a larger amount of total accumulated charge.

Bars 228 show a succession of subsequent RV pulses which are carried out as discussed above in FIG. 8. Any suitable number of successive pulses 228 may be applied, including a single pulse. It is contemplated that the pulses 228 will be similar to the program verify pulses applied at 224, except that low level sensing (including 0 volts) is applied, as indicated by PV sense threshold 230. To efficiently and effectively provide internal pathways to bleed the accumulated charge from the channel, it is contemplated that the dummy program sequence will use a lower sense threshold 230 as compared to threshold 226. The dummy sequence threshold voltage 230 may be lower than the threshold required to turn on the program states with the lowest accumulated charge (such as voltage V0 in FIG. 5). In this way, all of the memory cells may remain in a non-conductive state.

In one embodiment, the dummy program sequence can be carried out as a second programming sequence wherein a lowest program state is programmed to each of the memory cells after the desired program states have been achieved. For example, the system can operate to program each of the cells to the lowest state 11 and verify this state has been applied (e.g., voltage V1 in FIG. 5). In another embodiment, no program pulses are applied but the timing of the PV pulses are applied as if programming pulses had been supplied.

In another embodiment, different control line voltages may be respectively applied to the BL and SL (upper and lower control lines for a given memory stack; see FIG. 2). For example, during the "normal" program verify operation (bars 224) the BL may be set at some suitable rail voltage (e.g., 3.3V, etc.) and the SL may be at a reference level (e.g., electrical ground). During the "dummy" program verify operation (bars 228) both the BL and the SL may be set to electrical ground.

Figure 12:
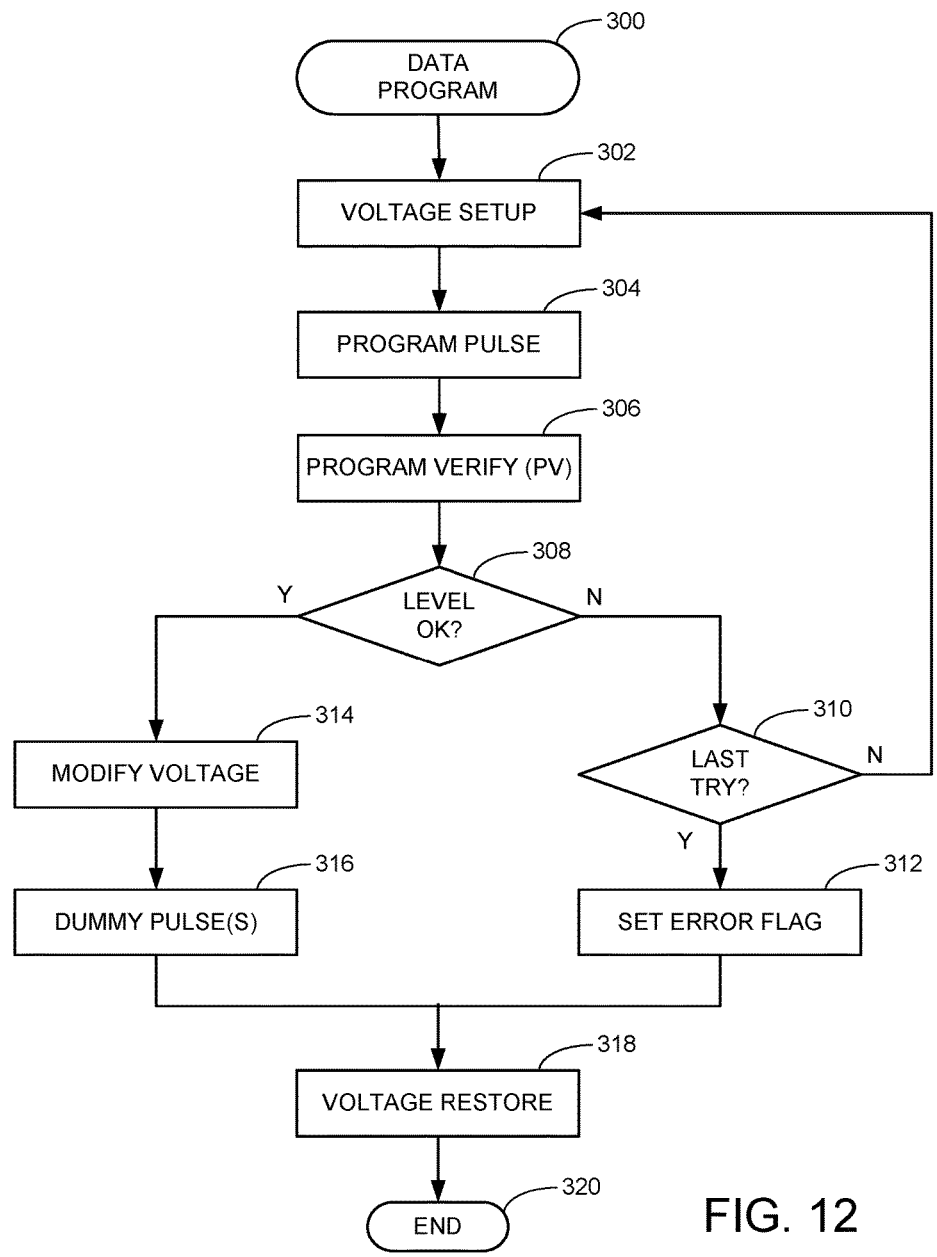
FIG. 12 is a flow chart for a DATA PROGRAM routine generally illustrative of steps carried out by the circuit of FIG. 9 in accordance with some embodiments.

FIG. 12 is a flow chart for a data program routine 300, illustrative of steps carried out in accordance with the foregoing discussion. The routine 300 may represent programming steps carried out by the program control circuit 220 of FIG. 10 during a normal program operation to program (write) input data supplied by a host device responsive to a host write command. The routine is merely illustrative and may be modified as required.

The servicing of a given host write (program) command includes a voltage setup at step 302 in FIG. 12. This includes establishing the appropriate voltages at the control lines (e.g., BL, WL, SL, SSL, GSL, etc.) to access the respective memory cells 112 to be programmed. A program pulse is next applied at step 304, which is carried out to transfer charge to the floating gate structure 140 of the associated memory cell as discussed above in FIG. 9. A program verify (PV) operation is carried out at step 306 to in response to the applied program pulse of step 304.

Decision step 308 determines whether the desired final program state has been achieved. If not, the flow passes to decision step 310 where a timeout limit is checked to determine whether a predetermined maximum number of program pulses have been applied. If not, the routine passes back to step 302 for the application of the next pulse. If the limit has been reached without the final desired program state being sensed, the flow passes to step 312 where an error flag is set, indicating a failure of the programming process. The system can proceed to address the program failure, including allocating a new location within the array 110 to store the data, deallocation of the existing memory location, etc.

At such time that the final desired program state is obtained, the flow passes from decision step 308 to step 314 where the voltages on the input control lines (e.g., BL, WL, SL, SSL, GSL, etc.) are modified to support the dummy program sequence. As mentioned previously, one way to carry this out is to assert the SSL and GSL gate control lines to place the selection devices in a conductive state and connect the BL and SL lines to electrical ground or some other appropriate reference level.

One or more dummy pulses are thereafter applied at step 316, as described above in FIG. 11. These can include application of appropriate voltages, including but not limited to low level (e.g., including substantially zero) voltages to the various word lines to assist in the bleeding of the accumulated charge from the channel body 134 (FIG. 4).

Once either the dummy program sequence of step 316 has been completed, or an error flag has been set at step 312, the routine continues to step 318 where a voltage restore operation is carried out to return the various control lines to a normal state, after which the routine ends at step 320.

Figure 13:
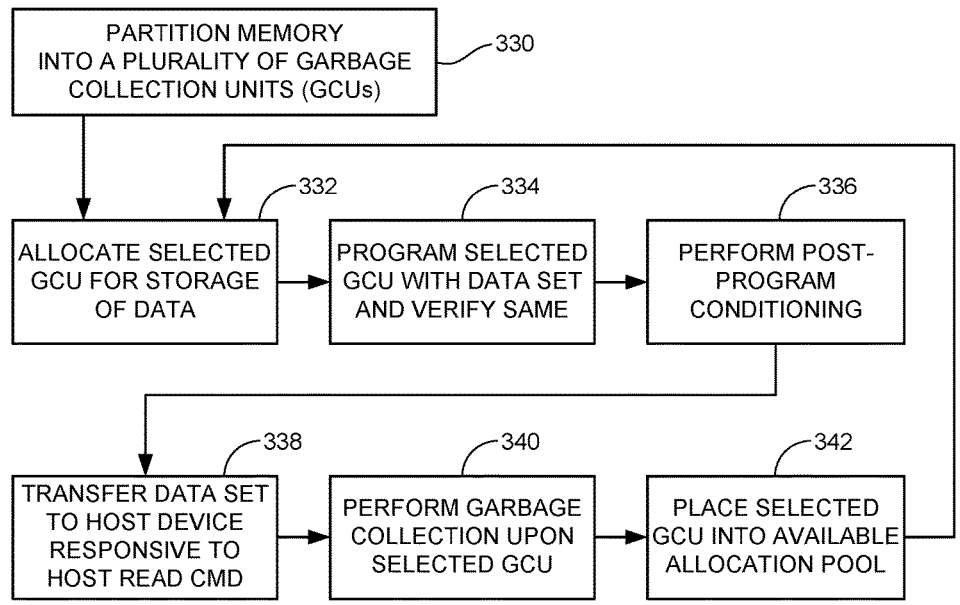
FIG. 13 is another flow sequence illustrative of steps carried out in some embodiments.

FIG. 13 provides another flow diagram to illustrate various steps that may be carried out in accordance with further embodiments. Step 330 involves partitioning a stacked memory such as the 3D NAND flash memory array 110 into a plural number of garbage collection units (GCUs). These may in turn be made up of multiple erasure blocks.

A selected GCU is allocated for the storage of user data from a host, as indicated at step 332. A user data set is transferred to the selected GCU at step 334. This will include a programming operation to program one or more stacks of memory cells in the array to desired program states, followed by a program verify (PV) operation to verify the programmed states. A post-program conditioning operation at step 336 applies the dummy program sequence to condition the verified memory cells. As will be appreciated, steps 334 and 336 generally correspond to the various steps in FIG. 12, such as programming (step 304), verifying (step 306) and conditioning (step 316), and may be carried out responsive to a host write command to write the data set to the array.

Once a given set of memory cells has been programmed, verified and conditioned, the data set stored by the memory cells is transferred to the host device one or multiple times responsive one or more host read commands at step 338. The various steps 334, 336 and 338 are repeated as necessary as new data are added to the GCU and read from the GCU responsive to various host read and write commands.

At some point, the user data stored in the selected GCU will become sufficiently stale (e.g., not the current version, read disturbed, etc.) and the system will proceed to perform a garbage collection operation upon the selected GCU, step 340. This may include copying current version data sets from the selected GCU to another available GCU, followed by the application of an erasure operation to reset all of the memory cells 112 in the selected GCU to an initial erased state (e.g., state 11 as depicted in FIG. 5). Once erased, the selected GCU is placed into an allocation pool of available GCUs at step 342, and the foregoing process steps are repeated.

Figure 14:
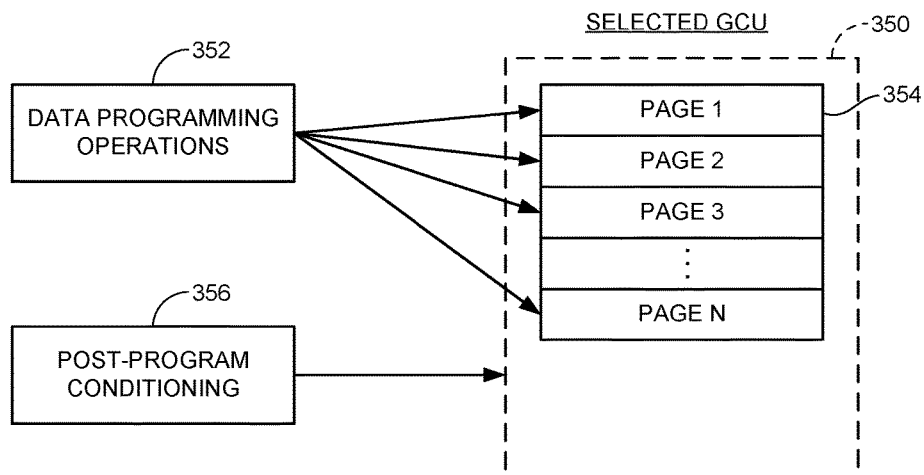
FIG. 14 shows another sequence of data programming and conditioning in accordance with some embodiments.

FIG. 14 shows another processing diagram to illustrate yet further embodiments. A selected GCU is generally referenced at 350. Data programming operations are carried out as indicated by block 352 to write data sets to each of a plurality of pages of memory 354. Once a total number of N data sets have been written to N corresponding pages, a single post-program conditioning operation can be applied as indicated at step 356. The post-program conditioning can be applied just to the N pages or a larger portion of the selected GCU 350, including all of the memory cells therein.

Figure 15:
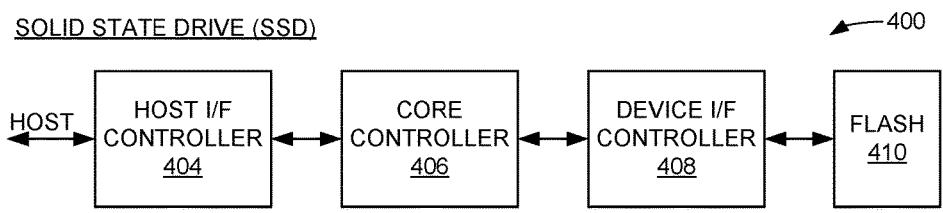
FIG. 15 illustrates an SSD controller circuit corresponding to the controller of FIG. 1 in accordance with further embodiments.

FIG. 15 shows a controller circuit 400 for another data storage device corresponding to the device 100 of FIG. 1. The data storage device is characterized as a solid state drive (SSD), although other configurations of data storage devices can be used. Other circuits and components may be incorporated into the SSD 400 as desired, but such have been omitted from FIG. 15 for purposes of clarity. The circuits in FIG. 15 may be incorporated into a single integrated circuit (IC) such as a system on chip (SOC) device, or may involve multiple connected IC devices.

The controller functions from FIG. 1 are carried out by a host interface (I/F) controller circuit 402, a core controller circuit 404 and a device I/F controller circuit 406. The host I/F controller circuit 404 may sometimes be referred to as a front end controller or processor, and the device I/F controller circuit 406 may be referred to as a back end controller or processor. Each controller 402, 404, 406 includes a separate programmable processor with associated programming (e.g., firmware, FW) in a suitable memory location, as well as various hardware elements, to execute data management and transfer functions. In other embodiments, a single programmable processor (or less than three programmable processors) can be configured to carry out each of the front end, core and back end processes using associated FW in a suitable memory location.

The front end controller 402 processes host communications with a host device (not separately shown). The back end controller 406 manages data read/write/erase (R/W/E) functions with a flash memory 408, which in turn may be made up of multiple flash dies to facilitate parallel data operations. The core controller 404, also referred to as the main controller or middle controller, performs the primary data management and control for the device 400.

Figure 16:
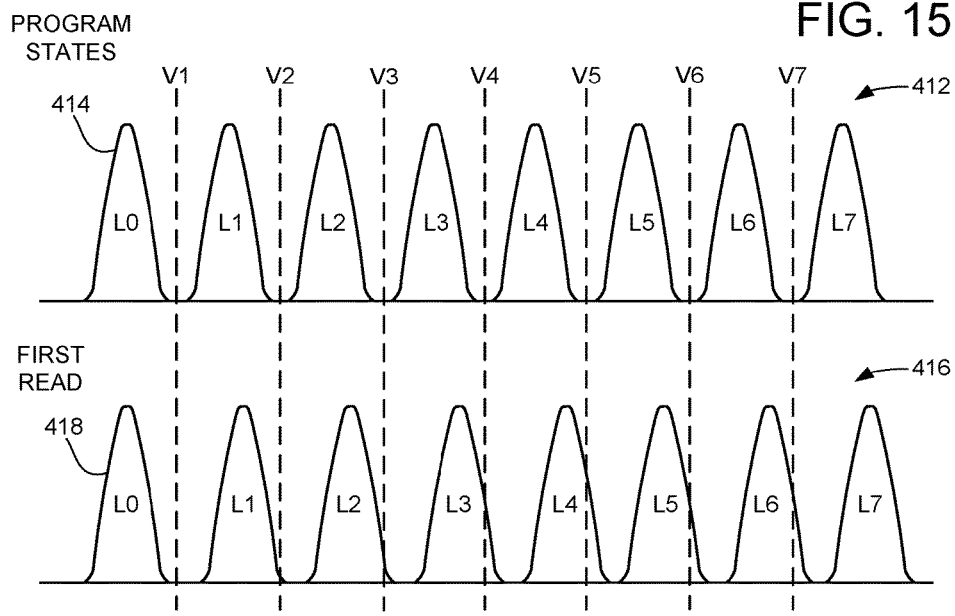
FIG. 16 shows three-level cell (TLC) charge distributions indicative of different data storage states for the flash memory cells in the stacked flash memory array in accordance with further embodiments.

FIG. 16 shows a population of charge distribution curves 412 to represent charge distributions 414 that may be programmed to the various flash memory cells in the flash memory 410. The memory cells are programmed as three level cells (TLCs) so that eight (8) storage states are used to represent three (3) bits ($2^N=2^3=8$). The use of TLCs is exemplary and not limiting, as other multiple level charge states can be used including MLCs (2 bits per cell), XLCs (4 bits per cell), etc. The charge distributions 414 are identified as having successively greater charge levels L0 to L7 which correspond to the following multi-bit programmed values:

TABLE I

| Charge Level | Program Bit Value | MSB | ISB | LSB |
|---|---|---|---|---|
| L0 | 111 | 1 | 1 | 1 |
| L1 | 110 | 1 | 1 | 0 |
| L2 | 101 | 1 | 0 | 1 |
| L3 | 100 | 1 | 0 | 0 |
| L4 | 001 | 0 | 0 | 1 |
| L5 | 000 | 0 | 0 | 0 |
| L6 | 011 | 0 | 1 | 1 |
| L7 | 010 | 0 | 1 | 0 |

Referring again to the MLC distributions of FIG. 5, it can be seen that the TLCs in FIG. 16 can be formed by writing an additional page of data to an existing set of MLCs. In this case, the most significant bit (MSB) of each cell corresponds to the first page that was written to the cells, which transitioned the cells from an erased state to SLCs. The intermediate significant bit (ISB) corresponds to the second written page, which transitioned the cells from SLCs to MLCs. The least significant bit (LSB) corresponds to the third written page, which transitioned the cells from MLCs to TLCs.

As mentioned above, the memory cells are connected to a common word line within a selected erasure block (e.g., a "row" of cells). The programmed state of each of the cells, and hence, the individual pages, can be sensed through the application of the various read sense voltages V1 through V7 to the row of memory cells in turn.

FIG. 16 further shows a second population of charge distribution curves 416 to represent shifted charge distributions 416 that may be observed due to the first read effect (floating body effect). The charge distributions 416 are somewhat shifted to the right as compared to the charge distributions 414. This is a transitory phenomenon since, once the first read operation has been performed, the memory cells in the associated erasure block will tend to return to the normal charge distributions 412, as discussed above.

Figure 17:
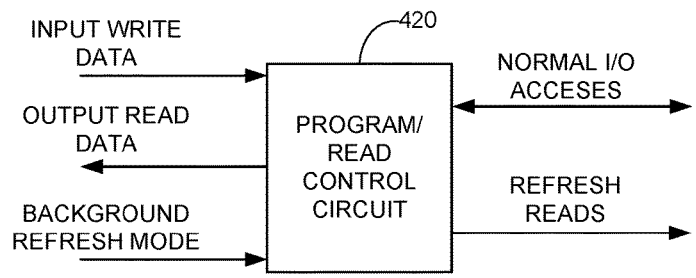
FIG. 17 is a functional block representation of a program/read control circuit of the controller circuit of FIG. 15 in further embodiments.

FIG. 17 is a functional block representation of a program/read control circuit 420 of the SSD 400 in some embodiments. The circuit 420 may take a variety of forms depending on the configuration of the SSD, and may form a portion of the back end controller 408. The circuit may be realized as hardware, one or more programmable processors, logic circuits, memory buffers, etc.

Instead of performing dummy read operations at the conclusion of each write operation as described in the embodiments above, the circuit 420 continuously performs a series of dummy read operations (refresh reads) in the background during the servicing of normal data I/O operations. In this manner, at least a significant portion of the erasure blocks in the memory 410 will, after receiving a write operation, receive one or more refresh reads before a first normal read operation is applied to transfer data from the erasure block to a requesting host device.

The normal data I/O operations may include the servicing of host access requests to write user data to and read user data from the flash memory 410, the storage and retrieval of metadata and other control data used by the SSD, the relocation of data from one erasure block to another such as during garbage collection operations, and so on.

The background mode may be selectively activated by a user of the device through a host level command received by the SSD. In other cases, the SSD may enact the background mode in response an indication by the core controller 406 based on observed conditions such as workload, observed RBER, etc. In still other embodiments, the background mode may be automatic feature that is always on when the SSD is placed into an operationally ready state.

Figure 18:
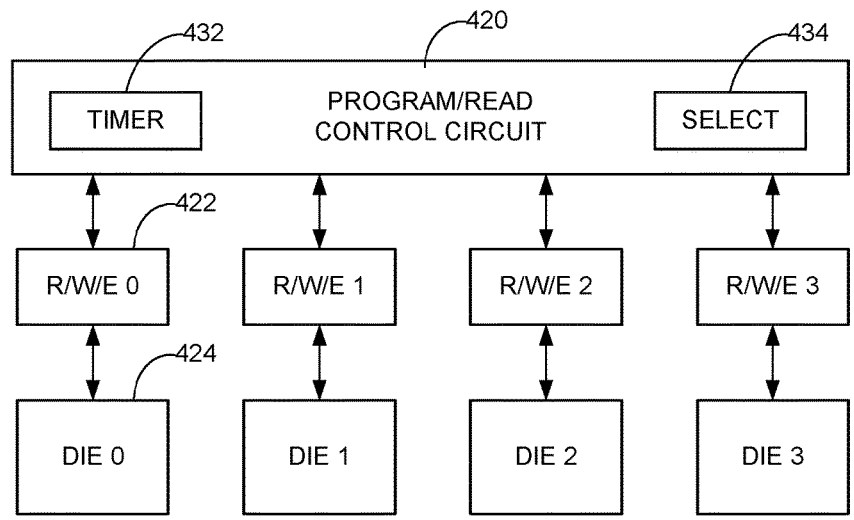
FIG. 18 shows interaction of the program/read control circuit of FIG. 17 with multiple dies and read/write/erase (R/W/E) circuits.

FIG. 18 shows the program/read control circuit 420 in conjunction with a number of read/write/erase (R/W/E) circuits 422 and flash dies 424. While a total of four (4) R/W/E circuits and four (4) dies are shown, any respective corresponding numbers of these elements may be provided (e.g., 8, 16, etc.). The R/W/E circuits 422 carry out respective read and write operations to the individual memory cells as discussed above in FIGS. 8 and 9. Each combination of an R/W/E circuit and associated die is referred to as a lane, and access operations can be carried out in parallel across the respective lanes at the same time.

Figure 19:
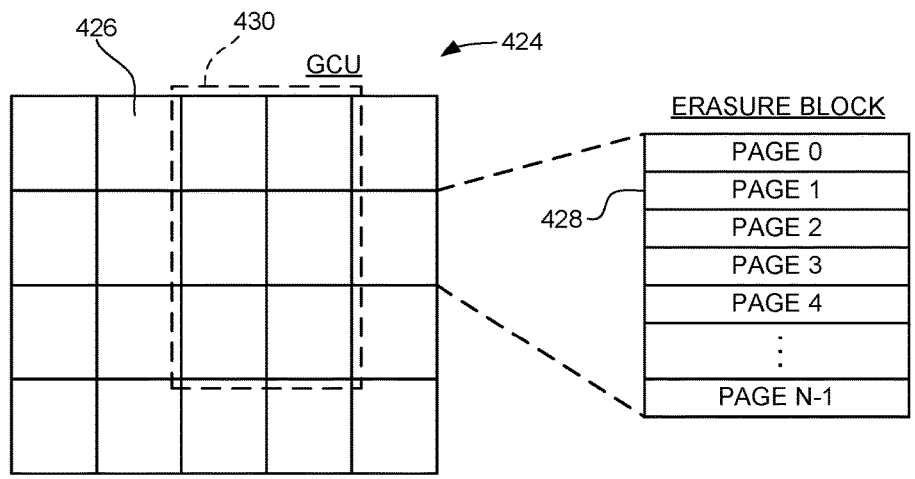
FIG. 19 shows further details regarding erasure blocks and garbage collection units of the stacked memory array.

FIG. 19 shows a schematic depiction of a portion of a selected die 424 from FIG. 18. The flash memory cells are arranged into a number of erasure blocks 426. Each of the erasure blocks 426 is an addressable set of memory cells and represents the smallest unit of memory that can be erased at a time. Each erasure block 426 can store up to N pages 428, which represent a set of data that can be written to all of the memory cells in an erasure block that are coupled to a common word line. Groups of erasure blocks may in turn be combined into larger garbage collection units (GCUs) 430, which are allocated and erased as a unit.

The total data storage capacity of a given erasure block 426 can be determined by the total number of rows (word lines) in the block as well as the form of memory cell configuration (e.g., SLCs, MLCs, TLCs, etc.). While the term "page" refers to a set of data, it is common to also refer to pages as page addresses as the locations within the erasure block. For example, page 0 in FIG. 19 may correspond to the MSB bits of the first row of memory cells in the erasure block; page 1 may be the MSB bits of that first row or some other location such as the MSB bits of a second row, etc. In some cases, all of the cells in the erasure block are written as SLCs before starting over and adding additional pages to convert to MLCs, followed by additional pages to convert to TLCs. An erasure block that has not yet been fully filled with data will likely have some combination of SLCs, MLCs and TLCs in the block.

Returning to FIG. 18, the program/read control circuit 420 performs the background reads so that each erasure block 426 in the memory 410 receives at least one read operation. A timer circuit 432 may be initialized so that the background reads are repeated over each of a succession of time intervals of selected duration, such as every X seconds where X is some suitable interval. In some embodiments, the interval is set at every eight seconds (X=8 sec), although other intervals can be used. The interval can be adaptively adjusted over time, such as to match workload requirements, reduce overall RBER (observed raw bit error rate) performance, etc.

The amount of data that is read from each block may be a page 428 or some other relatively small amount of data. In some cases, single level cell (SLC) read operations are performed during the background reads, since SLC sensing may be carried out faster than MLC or TLC reads. Referring again to FIGS. 8 and 16 as well as to Table I, SLC reads may be carried out by applying a single threshold voltage to the cells (in this case, voltage V4 in FIG. 16) and sensing whether the associated memory cell is rendered in a conductive state (distributions L0-L3) or remains in a non-conductive state (distributions L4-L7).

A refresh select circuit 434 of the program/read control circuit 420 can be used to select the various pages of data to be read from each erasure block 426 during the background mode. In some cases, a different page 428 is read from each block 426 during each interval. The selected pages may be incremented, randomly selected, etc. It is contemplated that a single read to any selected page 428 in a given erasure block 426 will be sufficient to substantially eliminate the first read effect for all subsequent reads to any of the pages stored in that block. However, in some cases multiple reads may be provided to a given erasure block during the background refresh mode.

The background reads are intended to refresh the various blocks at a sufficiently frequent rate such that, for each of at least a significant portion of the blocks in the memory, at least one of the background read operations will be performed prior to a first normal read operation upon that block since the most recent write operation that was carried out to that block. The interval duration may be selected such that, on average, writes will have likely occurred to many of the erasure blocks 426 since the most recent interval, but reads may not yet have occurred based on a normal read command issued to the back end processor (e.g., a host command, a garbage collection operation, etc.). Thus, in at least some cases, the background reads will help to drain the accumulated channel body charge resident from the most recent write operations so that, during the next received normal read command, the observed RBER will be at the normal, steady state level (see e.g., FIG. 7).

The rate at which the background reads are performed should be balanced against a number of factors. The reads require additional overhead processing that is applied by the system, which can affect host I/O transfer rate performance. On the other hand, not performing the background reads provide higher numbers of read errors during first normal read operations, which can also affect host I/O transfer rate performance due to the read recovery efforts necessary to correct uncorrectable errors during such first reads.

Wear is not a significant issue with regard to the background reads. Repeated program/erase cycles tend to provide wear to the memory cells over time, and this wear tends to accelerate with higher numbers of bits being stored in the memory cells (e.g., TLCs wear faster than SLCs). Repeated reads, however, do not tend to provide significant wear to the memory cells. Repeated reads do cause other issues, such as read disturb drift where the amount of charge stored in the various cells will shift (increase or decrease) as a result of many successive reads to a block of memory over time.

Read disturbed data caused by the additional background reads may, in some cases, increase the rate at which garbage collection operations are carried out upon the various GCUs 430. As will be recognized, garbage collection generally involves copying valid data to a new GCU, performing an erase operation on the existing GCU and returning the erased GCU to an allocation pool pending subsequent allocation. To the extent that more frequent garbage collection operations are required due to read disturbed data, this will increase the background processing required by the system, further reducing the available bandwidth to service host commands. These factors weigh in favor of using a longer time interval between the times that a given erasure block is consecutively refreshed.

On the other hand, the first read effect tends to increase observed RBER, which in turn increases the amount of processing required by the SSD to apply higher levels of read recovery operations when uncorrectable read errors are obtained during a read operation. This can include a number of corrective actions including read retries (with the same or adjusted sense voltages), the application of higher levels of outercode error correction to detect and correct the errors, different LDPC (low density parity check) decoder settings, etc. These actions also involve overhead processing that cannot be instead used to service other pending host access commands.

Finally, another factor that may influence the length of the timing interval for the background reads in some cases are the cache retention policies of the SSD. As will be appreciated, some devices may retain recently written data received from a host device in a local cache or buffer memory to facilitate cache hits from the local memory rather than from the flash memory. Such operation is particularly useful in devices that include other, slower forms of memory such as hybrid storage devices that include solid-state semiconductor memory (e.g., flash) as well as rotatable media (e.g., magnetic recording discs). It is noted that the background reads are intended to occur, in at least most cases, before the first normal read is applied to a block after the most recent write operation to that block. The extent to which subsequent reads are serviced from a local memory immediately after the data have been written to that block may, in some cases, delay the amount of time to the first normal read to the flash erasure block.

Accordingly, some suitable amount of time will be selected for the timing interval that takes into these and other factors. The timing interval can be adaptively adjusted by the circuit 420 to be shorter or longer as required based on observed parameters such as measured RBER, the types of reads (e.g., sequential v. random), write or read heavy workloads, measured host data I/O rates, the extent to which the system is employing read recovery efforts, etc.

Figures 20, 21:
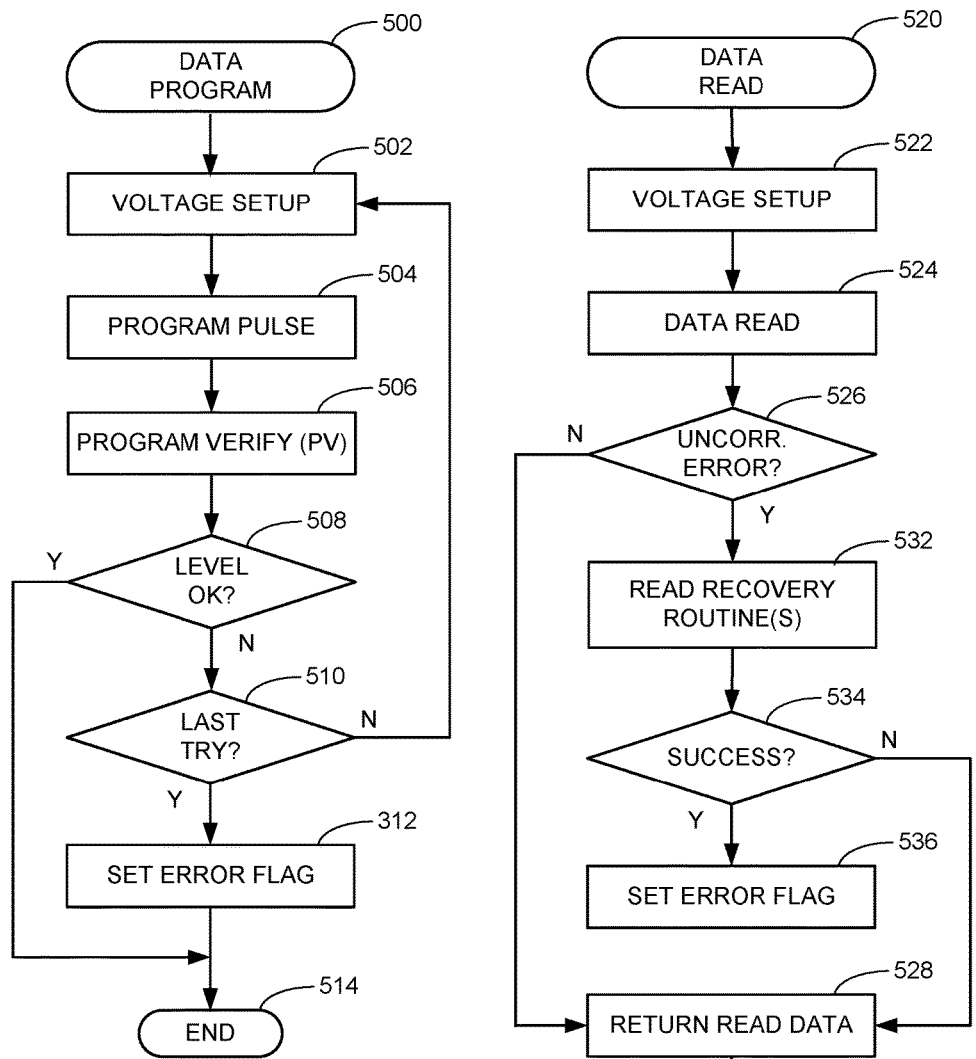
FIG. 20 is a flow chart for a data program routine illustrative of steps carried out in accordance with further embodiments.
FIG. 21 is a flow chart for a data read routine illustrative of steps carried out in accordance with further embodiments.

FIG. 20 is a flow chart for a data program routine 500 illustrative of steps carried out in accordance with some embodiments using the program/read control circuit 420. It will be appreciated that the flow of the routine 500 is similar to that of the routine 300 in FIG. 12, except that the dummy pulses are not provided at the conclusion of each program (write) operation in FIG. 20.

The servicing of a given host write command includes a voltage setup step 502 which establishes the appropriate voltages at the control lines (e.g., BL, WL, SL, SSL, GSL, etc.) to access the respective memory cells 112 to be programmed. Step 504 applies one or more program pulses to transfer charge to the floating gate structure 140 of the associated memory cell. Step 506 carries out a program verify (PV) operation to assess the progress of the programming operation.

Decision step 508 determines whether the desired final program state has been achieved. If not, the flow passes to decision step 510 where a timeout limit is checked to determine whether a predetermined maximum number of program pulses have been applied. If not, the routine passes back to step 502 for the application of the next set of pulses. An error flag is set at step 512 if the correct programming state has not been achieved within the required time. If the PV operation determines the cell has been correctly programmed, the routine ends at step 514.

FIG. 21 is a read routine 520 to show steps carried out during a normal read operation to carry out normal data I/O operations with the flash memory 410. As noted above, the normal reads may be requested by the core controller 404 responsive to host access commands or garbage collection operations, and the normal reads will be carried out under the control of the back end controller 406.

At step 522, a voltage setup operation occurs to select the various voltages that will be applied to recover the requested data (see e.g., voltages V1-V7 in FIG. 16). A data read operation is carried out at step 524 using the read circuitry such as depicted above in FIG. 9 to sense the programmed state of the desired data. Generally, in multi-bit cells where multiple pages of data are stored (e.g., MLCs, TLCs, etc.), one or more of the pages will be read during this step. Embedded error correction codes (ECC) or other mechanisms will be used to detect and correct up to selected numbers of bit errors in the recovered data.

Decision step 526 determines whether there are one or more uncorrectable errors in the recovered data; if not, the flow passes to step 528 where the recovered data are returned to a local buffer or other memory location pending subsequent processing (e.g., transfer to the host device, rewriting to a new location in the flash memory), and the routine ends at step 530.

Should one or more uncorrectable errors be present in the recovered data, the flow passes from step 526 to step 532 wherein one or more read recovery routines are carried out in an effort to recover the data. If these efforts are successful, step 534, the data are returned as before. If not, an error flag is set at step 536 and other corrective actions may be taken as well.

Figures 22, 23:
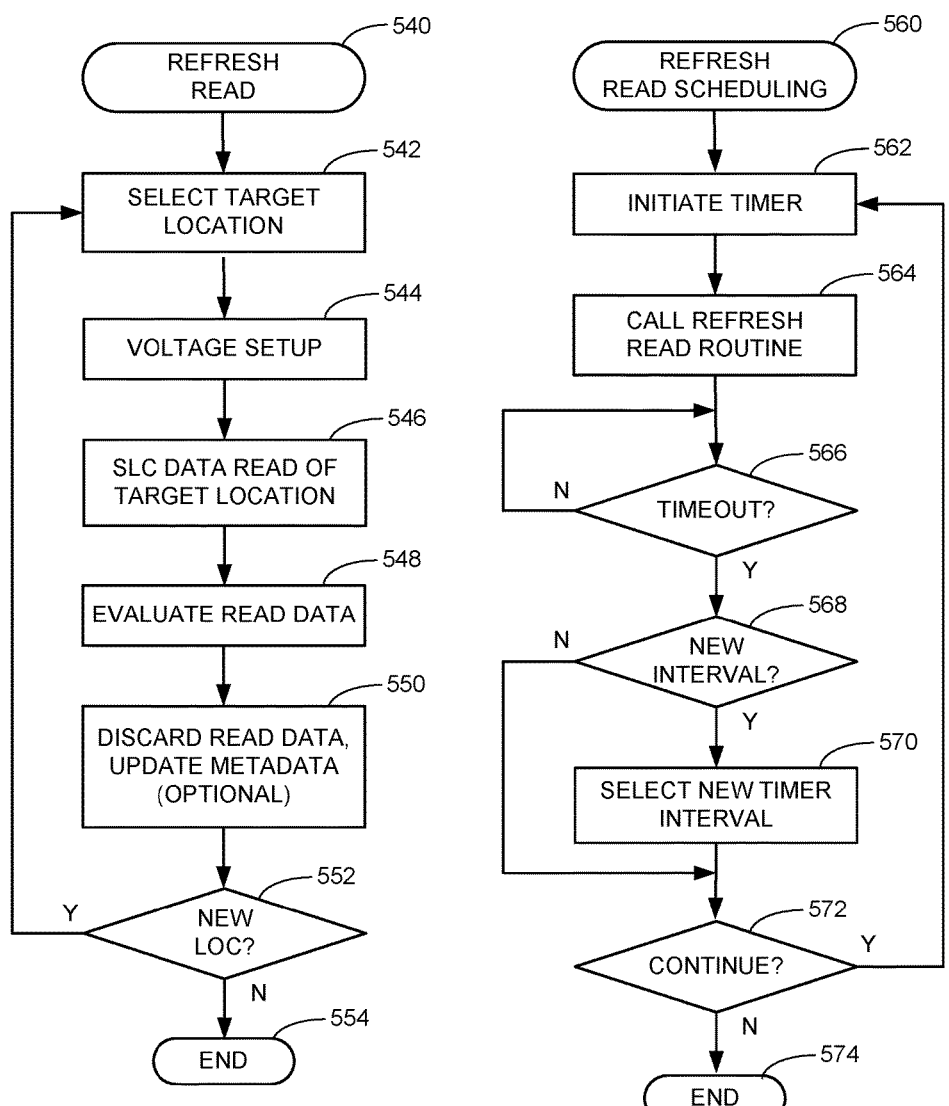
FIG. 22 is a flow chart for a refresh read routine illustrative of steps carried out in accordance with further embodiments.
FIG. 23 is a flow chart for a refresh read scheduling routine illustrative of steps carried out in accordance with further embodiments.

FIG. 22 is a flow chart for a refresh read routine 540 indicative of steps carried out in the background by the circuit 420 during the concurrent operation of routines 500, 520 of FIGS. 20-21. At the beginning of each time interval, a target location is selected at step 542. This may be a single page location in a selected erasure block 426, or some other target location. When multiple lanes are available, one location per lane may be selected.

A voltage setup operation is performed at step 544. The voltage setup may be selection of an appropriate SLC sense voltage (e.g., V4 in FIG. 16) for the memory cells at the target location. An SLC read is next carried out at the target location, step 546. The read data may be evaluated at step 548, although such is not necessarily required; that is, error correction decoding and other analyses may be carried out, but such are not necessarily required. The data may be simply pulled into a local buffer and immediately discarded, step 550.

The data may be useful for other purposes, however. If errors are detected, for example, metadata or other system control information may be updated at this time. If read disturb or other effects are detected, the erasure block may be marked for garbage collection. Similarly, the constantly performed background reads allow the circuit 420 to perform up-to-date current assessments of measured RBER, enabling other adjustments to be made to the system (e.g., changes to the time interval, garbage collection scheduling, adjustments of other channel parameters such as read voltages, etc.).

Decision step 552 determines whether additional locations need to receive background reads; if so, the foregoing steps are repeated until at least one read has been performed for every erasure block in the system (or a selected subset thereof), after which the routine ends at step 554. Routine 540 thus represents one pass through the background read operation over one time interval.

While the routine 540 shows the use of SLC reads, such is merely exemplary and not limiting. Other forms of reads such as MLC or TLC reads can be carried out. Multiple pages of data can be read. One type of read (such as SLCs) can be carried out some number Y times in a row (e.g., 1000 cycles) and then another type of read (such as TLCs) can be inserted. These and other variations will readily occur to the skilled artisan in view of the present disclosure.

FIG. 23 shows a refresh read rescheduling routine 560 that runs in conjunction with routine 540 of FIG. 22. Routine 560 schedules each successive operation of routine 540 so that the refresh reads are performed on a regular recurring basis, such as every eight (8) seconds or some other value. Longer or shorter values can be used, such as but not limited to less than every second, less than every 10, 30, 60, 90, 120 seconds, etc. While relatively short intervals are contemplated, this is not limiting; durations involving hours, days, weeks, etc. can also be used as desired.

A timer such as the timer circuit 532 (see FIG. 18) is initialized at step 562 for a selected time interval. The refresh read routine 540 of FIG. 22 is thereafter called and executed at step 564. It is contemplated that the complete cycling of the routine 540 to read all of the selected erasure blocks will take less time than the duration of the time interval, so decision step 566 provides a wait loop until the selected time interval is completed.

At step 568, the routine determines whether a new, different time interval should be used. As discussed above, parametric measurements or other factors may result in an operation by the circuit 420 to shorten or lengthen the timing interval. If so, a new timer interval is selected at step 570. Decision step 572 determines whether the refresh read cycling should continue; if so, the routine returns to step 562 and the foregoing steps are repeated. Ultimately, once the read refresh operations have concluded, such as by disabling the background read mode, the routine ends at step 574.

Some of the foregoing embodiments have envisioned providing background reads to every addressable (erasure) block in the system, or a selected portion thereof, during each of the timing intervals. In this way, the background reads provide continuous, low level background reads during servicing of normal read commands. While this provides a little bit of extra overhead processing, it has been found that this can proactively provide better overall host data I/O performance since higher RBER effects on first reads are reduced, so that fewer resources are consumed performing read retries, etc. during read recovery efforts. This solution is simple, balanced and scheduled.

In related embodiments, additional statistics may be maintained by the metadata in the system to denote when a most recent write operation has been carried out to a given block. In such a case, because the first read effect is somewhat transitory, should the time interval since the most recent write operation be greater than some predetermined threshold, the background reads for this case may be omitted. A time/date stamp type data value can be recorded indicative of the most recent access (read/write) operation.

In further cases, a flag bit could be set in metadata for each write to each erasure block or other set of memory. The flag bit could be toggled from a first value (such as 0) to a second value (such as 1) when a write has occurred to that block. Performing a read would change the flag bit back to the initial bit (e.g., from 1 to 0). In this way, background reads could be performed only on those erasure blocks that have a 1 as the flag bit, thereby potentially reducing the number of background reads. This may be useful in some environments.

Other related approaches involve adjusting the read voltage of the first normal read, thus allowing a transition from the shifted distributions back to the normal levels. The adjusted read voltages can be used for situations where the elapsed time since the most recent write is less than a selected threshold. Hence, one set of read voltage thresholds may be applied if the time since the most recent write (and no intervening reads) is less than Z, and a different set of read voltage thresholds can be applied if the time is greater than Z. Using a constant time interval for the background reads can help ensure proper calculation of the respective voltages.

In still further approaches, predicted reads can be used to trigger background reads of blocks that are about to be read. This can be particularly useful in sequential workloads where large numbers of sequentially addressed blocks (e.g., sequential LBAs, etc.) are read.

Stronger code rates may be used for the first page or the first grouping of pages in a given erasure block or data sequence. Stronger code rates can include higher forms of ECC, outer codes, more powerful LDPC decoder values, etc. Using a stronger code rate for the first page or first grouping of pages can help reduce these pages from going into error recovery operations and causing a system performance degradation at the beginning of a read operation. As before, this can be particularly useful in sequential workloads. These and other approaches can be used in conjunction with or apart from the scheduled reads discussed above.

While 3D NAND flash memory has been used as a particular example, it will be appreciated that any number of stacked non-volatile solid-state memory cells may benefit from the disclosed technique.

It is to be understood that even though numerous characteristics and advantages of various embodiments of the present disclosure have been set forth in the foregoing description, together with details of the structure and function of various thereof, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. An apparatus comprising:
a semiconductor memory comprising memory cells arranged into addressable blocks, each of the memory cells characterized as a non-volatile memory cell and configured to store multiple bits; and
a program/read control circuit configured to program data sets to and read data sets from the memory cells in the addressable blocks to service a sequence of host access commands, and to perform background reads in conjunction with the servicing of the host access commands, the background reads reading a different data set from each of the addressable blocks over each of a succession of time intervals of selected duration to condition the memory cells prior to a first read operation associated with the host access commands,
the program/read control circuit configured to further perform the first read operations from the conditioned memory cells to service respective host access commands after the respective background reads.

2. The apparatus of claim 1, wherein the semiconductor memory comprises stacked memory cells and each background read operates to retrieve a data set from an associated one of the addressable blocks, the data set formed of multiple bits with each bit of the data set stored in a different one of a plurality of the memory cells connected to a common word line of the associated one of the addressable blocks.

3. The apparatus of claim 2, wherein the stacked memory cells are three dimensional (3D) NAND flash memory cells and the addressable blocks are erasure blocks, each erasure block comprising a smallest unit of the memory cells that can be erased at a time.

4. The apparatus of claim 1, wherein the program/read control circuit comprises a timer circuit which is initiated to denote a first selected time interval, and wherein the background reads are initiated at a commencement of the first selected time interval and conclude prior to a conclusion of the first selected time interval.

5. The apparatus of claim 4, wherein at the conclusion of the first selected time interval, the timer circuit is reinitiated to denote a second selected time interval, wherein the background reads are initiated at a commencement of the second selected time interval and conclude prior to a conclusion of the second selected time interval, and wherein the second selected time interval immediately follows the first selected time interval.

6. The apparatus of claim 5, wherein the first selected time interval has a first duration and the second selected time interval has a different, second duration, the second duration selected responsive to a measured parameter obtained from the background reads.

7. The apparatus of claim 1, wherein at least a portion of the memory cells are configured as three-level cells (TLCs) so that each TLC stores three bits, and wherein the background reads are single level cell (SLC) reads which read a single bit from each of the TLCs.

8. The apparatus of claim 1, wherein the program/read control circuit comprises a programmable processor having associated programming in a memory location which, when executed, causes the programmable processor to direct the servicing of the host access commands and to direct the performance of the background reads.

9. The apparatus of claim 1, wherein the program/read control circuit further calculates a raw bit error rate (RBER) and adjusts the selected duration of the time intervals responsive to the calculated RBER.

10. The apparatus of claim 9, wherein the RBER is calculated using data obtained from the background reads.

11. The apparatus of claim 1, characterized as a solid-state drive (SSD), wherein the semiconductor memory comprises NAND flash memory.

12. A method comprising:
    servicing a plurality of host access commands to transfer data between a host device and a semiconductor memory, the semiconductor memory comprising memory cells arranged into addressable blocks, each of the memory cells characterized as a non-volatile memory cell and configured to store multiple bits;
    performing a plurality of background reads during the servicing step, the background reads reading a different data set from each of the addressable blocks over each of a succession of time intervals of selected duration to condition the memory cells prior to a first read operation associated with the host access commands; and
    performing the first read operations from the conditioned memory cells to service respective host access commands after the respective background reads.

13. The method of claim 12, wherein the background reads comprise reading only a single page of data from each of the addressable blocks during each time interval in the succession of time intervals.

14. The method of claim 12, wherein the servicing step comprises performing a program operation to program a set of the memory cells in a selected addressable block to a selected set of accumulated charge levels, followed by a program verify operation to verify the set of the memory cells are correctly programmed to the selected set of accumulated charge levels, and wherein the performing step comprises performing a selected background read operation on a second set of the memory cells in the selected addressable block after the program verify operation and prior to a subsequent read operation of the servicing step to read a data set stored in a third set of the memory cells in the selected addressable block.

15. The method of claim 12, further comprising:
    initializing a timer circuit to denote a first selected time interval;
    initiating the background reads of the performing step responsive to the initialization of the timer and concluding the background reads of the performing step prior to a conclusion of the first selected time interval;
    re-initializing the timer circuit to denote a second selected time interval responsive to the conclusion of the first selected time interval; and
    repeating the initiating step during the second selected time interval.

16. The method of claim 15, wherein the background reads access a first set of locations within the addressable blocks to recover a first set of data therefrom during the first selected time interval, and wherein the background reads access a different, second set of locations within the addressable blocks to recover a different, second set of data therefrom during the second selected time interval.

17. The method of claim 15, wherein the first selected time interval has a first duration and the second selected time interval has a different, second duration, the second duration selected responsive to a measured parameter obtained from the background reads.

18. The method of claim 12, wherein the semiconductor memory comprises stacked memory cells and each background read operates to retrieve a data set from an associated one of the addressable blocks, the data set formed of multiple bits with each bit of the data set stored in a different one of a plurality of the memory cells connected to a common word line of the associated one of the addressable blocks.

19. The method of claim 12, wherein at least a portion of the memory cells are configured as three-level cells (TLCs) so that each TLC stores three bits, and wherein the background reads are single level cell (SLC) reads which read a single bit from each of the TLCs.

20. The method of claim 12, further comprising measuring an elapsed period of time since a most recent write operation to a selected addressable block, and not performing a background read to the selected addressable block during the performing step responsive to the elapsed period of time exceeding a predetermined threshold.

* * * * *